United States Patent
Chen et al.

(10) Patent No.: US 9,048,268 B2
(45) Date of Patent: Jun. 2, 2015

(54) METHOD AND EQUIPMENT FOR REMOVING PHOTORESIST RESIDUE AFTER DRY ETCH

(71) Applicant: Taiwan Semiconductor Manufacturing Co., Ltd., Hsin-Chu (TW)

(72) Inventors: Mu-Chen Chen, Jhubei (TW); Yi-Tse Huang, Qionglin Township (TW); Wei-Fan Liao, Donggang Township (TW); Han-Ti Hsiaw, Zhubei (TW); Chia-I Shen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 39 days.

(21) Appl. No.: 13/785,172

(22) Filed: Mar. 5, 2013

(65) Prior Publication Data

US 2014/0256138 A1 Sep. 11, 2014

(51) Int. Cl.
| | |
|---|---|
| *H01L 21/311* | (2006.01) |
| *H01L 21/67* | (2006.01) |
| *H01L 21/312* | (2006.01) |
| *H01L 21/322* | (2006.01) |
| *H01L 21/02* | (2006.01) |
| *H01L 21/3065* | (2006.01) |
| *H01L 21/308* | (2006.01) |

(52) U.S. Cl.
CPC ........ *H01L 21/67051* (2013.01); *H01L 21/312* (2013.01); *H01L 21/3065* (2013.01); *H01L 21/31138* (2013.01); *H01L 21/3225* (2013.01); *H01L 21/308* (2013.01); *H01L 21/67028* (2013.01); *H01L 21/02063* (2013.01); *H01L 21/0209* (2013.01); *H01L 21/31133* (2013.01)

(58) Field of Classification Search
CPC ........................ H01L 21/311; H01L 21/31127
See application file for complete search history.

(56) References Cited

U.S. PATENT DOCUMENTS

| | | | |
|---|---|---|---|
| 5,770,523 A | 6/1998 | Hung et al. | |
| 6,187,684 B1 | 2/2001 | Farber et al. | |
| 6,833,233 B2 | 12/2004 | Cheng et al. | |
| 7,205,167 B2 | 4/2007 | Chen et al. | |
| 2003/0201543 A1* | 10/2003 | Cheng et al. | 257/774 |
| 2004/0154743 A1* | 8/2004 | Savas et al. | 156/345.5 |
| 2005/0090113 A1 | 4/2005 | Chang | |
| 2007/0012336 A1* | 1/2007 | Su et al. | 134/1 |

* cited by examiner

*Primary Examiner* — Cheung Lee
(74) *Attorney, Agent, or Firm* — Duane Morris LLP

(57) ABSTRACT

A method for removing photoresist residue includes etching a photoresist layer disposed over a front side of a semiconductor substrate during fabrication of a semiconductor device, and exposing at least one of the front side and the back side of the semiconductor substrate to an atmosphere comprising active oxygen. The method further includes cleaning at least one of the front side and the back side of the semiconductor substrate with a cleaning fluid.

18 Claims, 18 Drawing Sheets

METHOD AND EQUIPMENT FOR REMOVING PHOTORESIST RESIDUE AFTER DRY ETCH

FIELD

This disclosure relates to semiconductor processing and equipment. More particularly, the disclosed subject matter relates to a process and an apparatus of removing photoresist residues produced in the fabrication of semiconductor device.

BACKGROUND

Photoresists are commonly used in photolithography processes during fabrication of semiconductor devices comprising integrated circuits (IC). In the fabrication processes, photoresists are also used for patterning. Photoresist patterning includes process steps such as photoresist coating, softbaking, mask aligning, pattern exposing, photoresist development, and hard baking. Photoresists are eventually removed through dry or wet etching, stripping and/or other cleaning processes.

Any photoresist residues remaining on the semiconductor device will affect the quality of subsequent processing steps, and may even damage structures of semiconductor devices. Meanwhile, as sizes of active circuit elements in ICs continues to decrease, with corresponding increases in the pattern densities of circuits in these ICs, quality of each processing step and resulting features of devices should be precisely controlled.

Via holes are through holes made in a substrate, for different purposes. For example, via holes are used to connect circuit patterns in adjacent metal layers, or to ground semiconductor devices and passive devices. Via holes are made through dielectric layers, for subsequent metal deposition to form a plug and create interconnect between two metal lines in different layers. Multi-level interconnect schemes employ such via holes in large numbers. Processes used to perform such interconnection using via holes include the single damascene process and the dual-damascene process.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

DETAILED DESCRIPTION

Figure 1A:
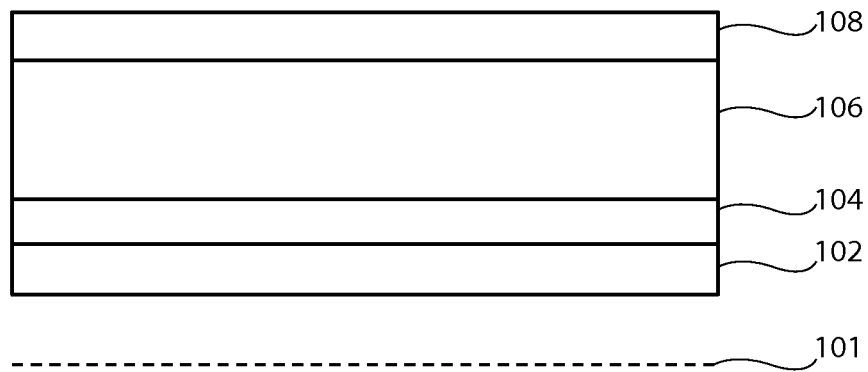
FIGS. 1A-1K are cross-sectional views of a portion of a semiconductor device during fabrication, illustrating an exemplary process of forming a via hole which comprises a method of removing photoresist residue after dry etch in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The semiconductor devices such as CMOS devices continue to be scaled to smaller sizes to meet advanced performance. Fabrication of device with such small dimensions involves precise controls. When photoresists are commonly used during fabrication of semiconductor process, it becomes increasingly important to thoroughly clean any photoresist residues remaining on the semiconductor device, especially those remaining inside trenches and via holes.

After a process of photoresist patterning including plasma etching, a scrubbing process can be used to remove photoresist. A cleaning fluid such as water is sprayed onto a front side surface of a wafer having photoresists, optionally in combination with the use of mechanical force. However, some polymer defects resulting from the photoresist residues could still be found inside trenches and via holes, on a front side surface, and even a back side of a wafer. In some embodiments, these photoresist residues are to be more thoroughly removed before a next step of process.

The present disclosure provides a method for removing photoresist residue during fabrication of semiconductor device, a method for making a semiconductor device having a via hole which comprises removing photoresist residue, and an apparatus which can be used for the process in accordance with some embodiments. The inventors have determined that photoresist residues are better or completely removed, after exposing at least one or both of the front side and a portion of the back side of a semiconductor wafer to an atmosphere comprising active oxygen after a process of photoresist patterning.

Unless expressly indicated otherwise, references to "active oxygen" made in this disclosure will be understood to encompass a reactive chemical species comprising oxygen which can oxidize photoresist used during a process of fabricating a semiconductor device. The reactive chemical species comprising oxygen can dissociate into atomic oxygen, oxygen radical, oxygen ions, or any other oxygen-containing reactive species which can react with chemical linkages in the photoresist such as C—H and C—C bonds. Examples of such an atmosphere comprising active oxygen include but are not limited to atmosphere comprising ozone ($O_3$) or other oxygen-containing species under ultra violet (UV) light, and oxygen containing plasma. In FIGS. 1A-1K, FIGS. 2A-2D and FIGS. 3A-3D, like items are indicated by like reference numerals, and for brevity, descriptions of the structure, provided above with reference to the previous figures, are not repeated. The methods described in FIGS. 4A-4B are described with reference to the exemplary structures described in FIGS. 1A-1K.

Figure 4A:
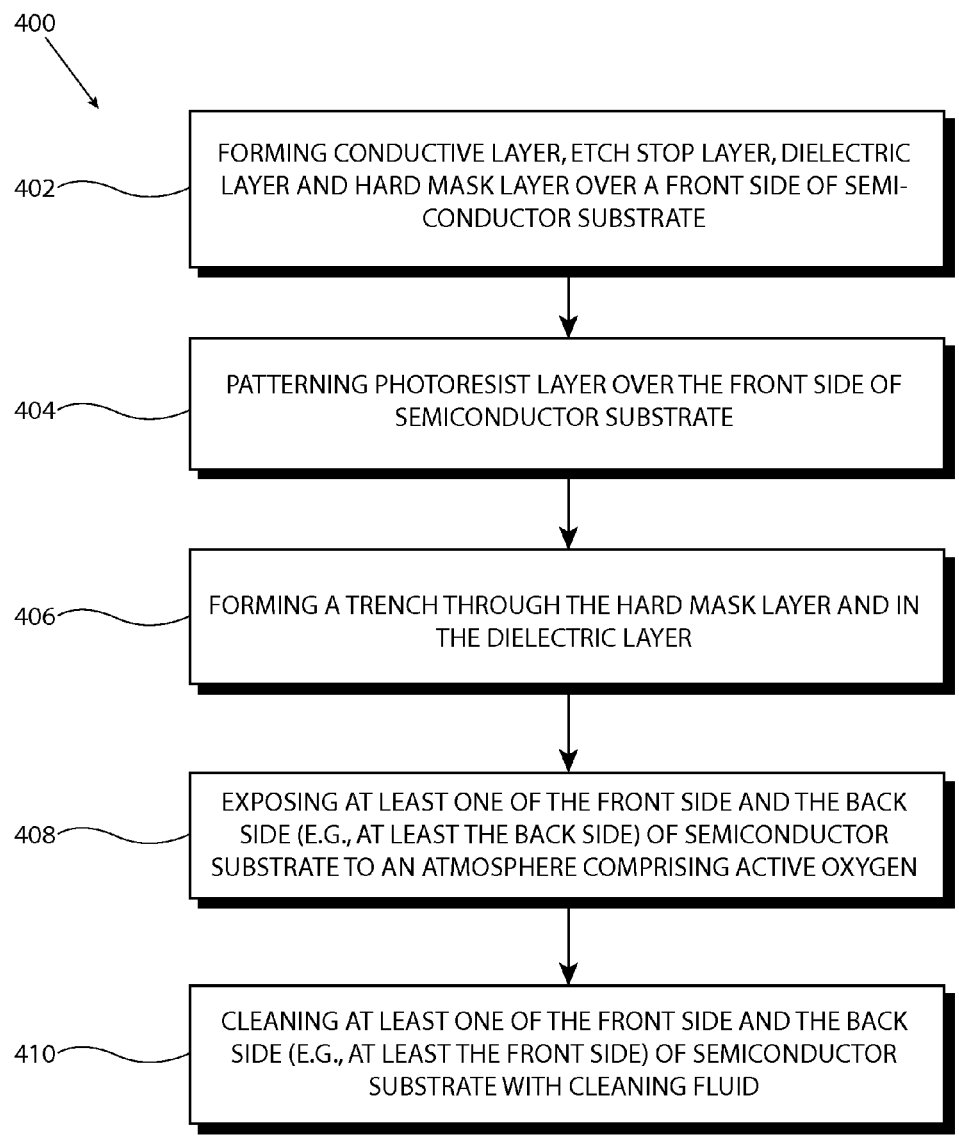
FIGS. 4A-4B are flow chart diagrams illustrating an exemplary method of forming a via hole which comprises a method of removing photoresist residue after dry etch in accordance with some embodiments.
Figure 4B:
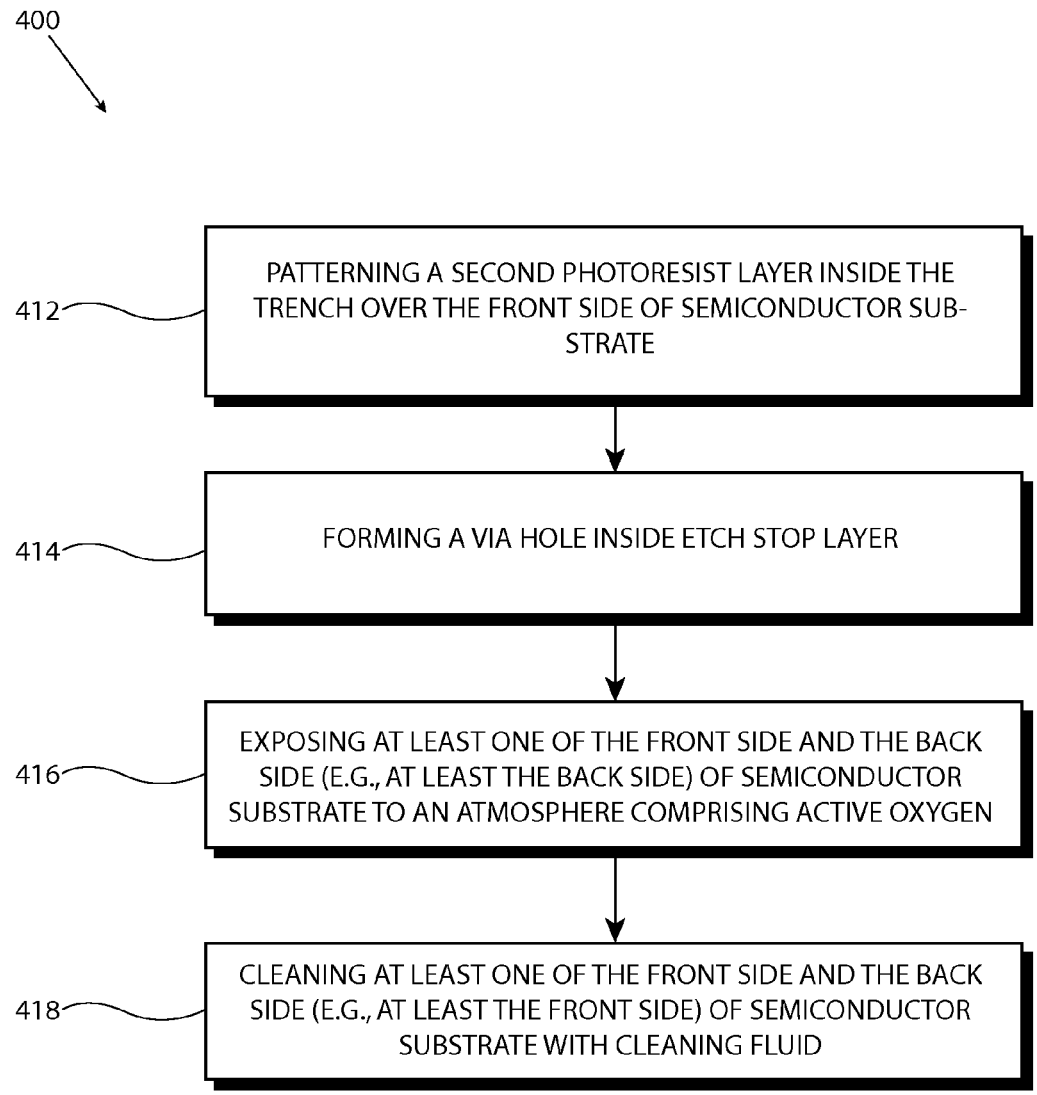

FIGS. 4A-4B are flow chart diagrams illustrating an exemplary method 400 of forming a via hole in accordance with some embodiments. FIGS. 1A-1K are cross-sectional views of a portion of a semiconductor device during fabrication, illustrating the exemplary process 400 in accordance with some embodiments.

Figure 5:
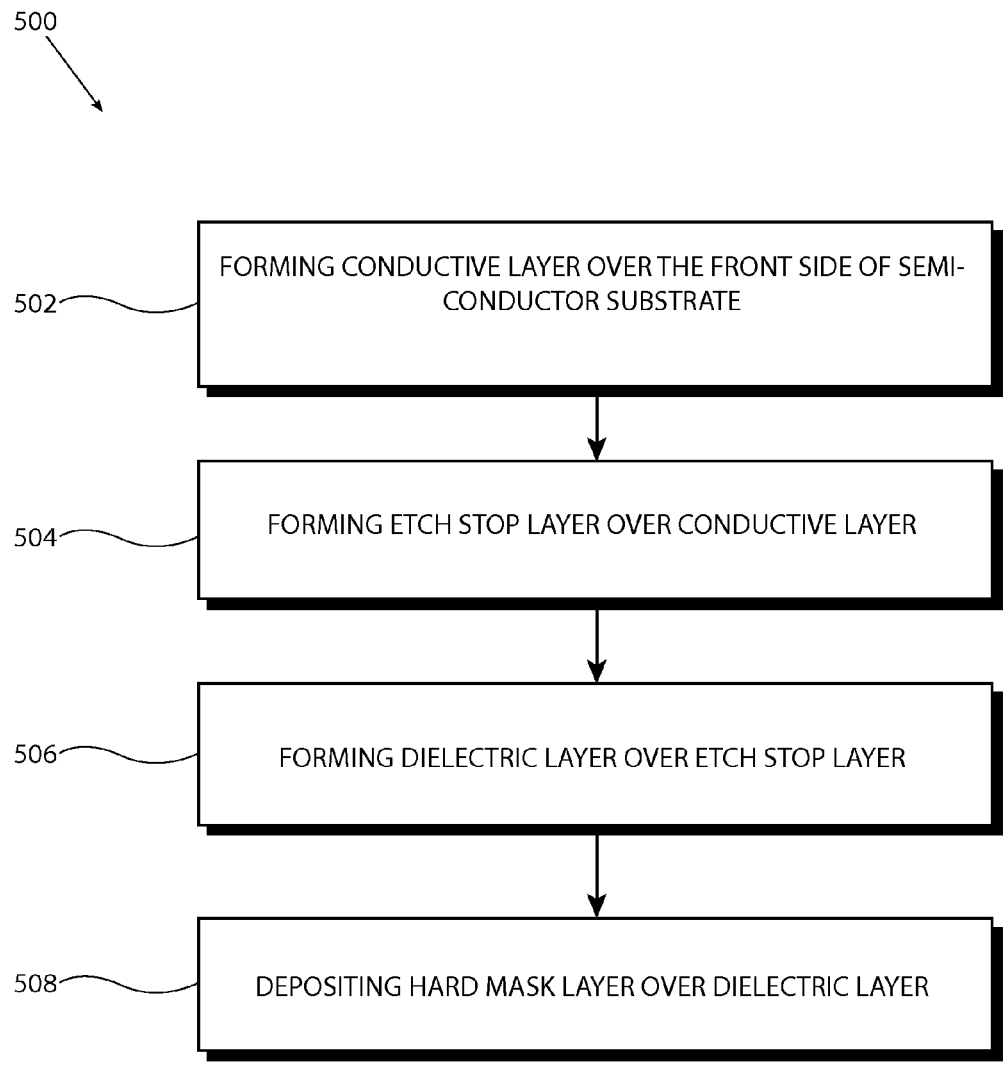
FIG. 5 is a flow chart diagram illustrating a method of forming a conductive layer, an etch stop layer, a dielectric layer and a hard mask layer over a front side of a semiconductor substrate in accordance with some embodiments.

Step 402 is a process comprising forming a conductive layer 102, an etch stop (ES) layer 104, a dielectric layer 106 and a hard mask (HM) layer 108 over a front side of a semiconductor substrate 101. FIG. 5 illustrate an exemplary process of forming a conductive layer 102, an ES layer 104, a dielectric layer 106 and a HM layer 108 over a semiconductor substrate 101 in accordance with some embodiments. The structure of a portion of a semiconductor device having these layers is shown in FIG. 1A.

Substrate 101 is shown in phantom in FIG. 1A-1K. Semiconductor substrate 101 has a back side surface opposite to the front side surface. Substrate 101 can be a wafer comprising a semiconductor material. Examples of suitable materials for substrate 101 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass. Substrate 101 is silicon in some embodiments.

At step 502 of FIG. 5, a conductive layer 102 is formed over the front side of semiconductor substrate 101. Examples of a suitable material for conductive layer 102 include but are not limited to aluminum, copper, titanium, tantalum, tungsten, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. Conductive layer 102 is copper in some embodiments. Conductive layer 102 can be formed by using chemical vapor deposition (CVD), high density plasma CVD, sputtering, or other suitable method.

At step 504 of FIG. 5, etch stop (ES) layer 104 is formed over conductive layer 102. ES layer 104 can be formed of silicon nitride, silicon oxynitride, silicon carbide, silicon oxycarbide, combinations thereof, or other suitable materials. In some embodiments, ES layer 104 is formed of silicon nitride. ES layer 104 can be formed by using chemical vapor deposition (CVD), high density plasma CVD, sputtering, or other suitable method.

At step 506, a dielectric layer 106 is formed over ES layer 104. Examples of suitable materials for dielectric layer 106 include but are not limited to silicon oxide, silicon oxynitride, phosphosilicate galss (PSG), borophosphosilicate glass (BPSG), combinations thereof, or other suitable material. Dielectric layer 106 can be formed by using CVD, high density plasma CVD, spin-on, sputtering, or other suitable method.

At step 508 of FIG. 5, a hard mask (HM) layer 108 is deposited over dielectric layer 106. Examples of a suitable material for hard mask 108 include but are not limited to silicon oxide, silicon nitride (e.g., $Si_3N_4$), SiON, SiC, SiOC, or any combination thereof. In some embodiments, hard mask layer 108 comprises silicon oxide.

Figure 1B:
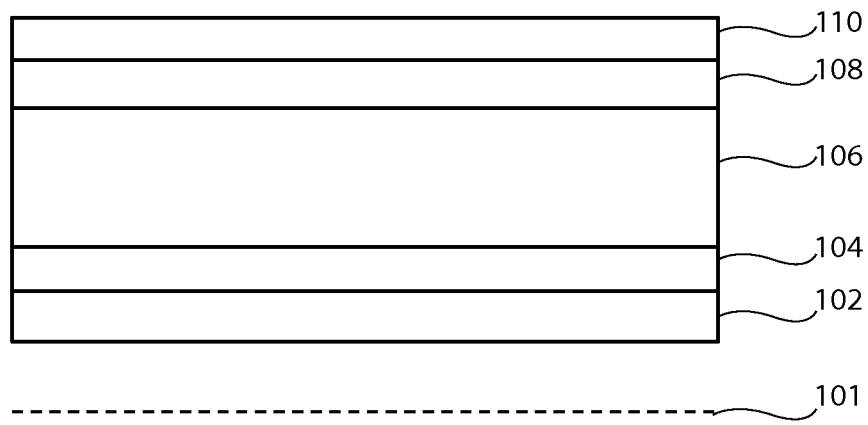

At step 404 of FIG. 4A, a photoresist layer 110 is coated and patterned over the front side of the semiconductor substrate 101. The resulting structure is illustrated in FIG. 1B. Photoresist layer 110 can be formed of either a positive or a negative photoresist material. Photoresist layer 110 can be coated through spin-on or other suitable method.

Figure 1C:
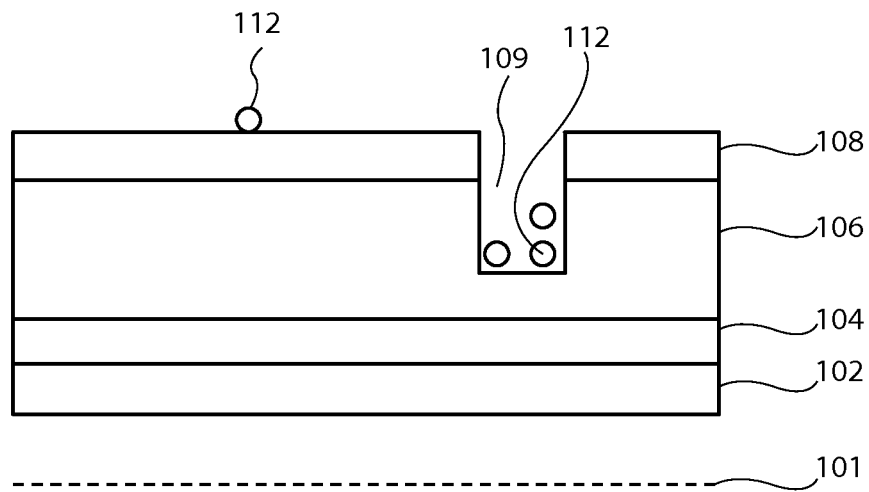

At step 406, a trench 109 is formed through HM layer 108 and in dielectric layer 106 through photoresist patterning. The resulting structure is shown in FIG. 1C. In some embodiments, the step of forming the trench 109 includes a dry etch process. For example, photoresist layer 110 can be exposed to UV light or other irradiation under a mask. After photoresist layer 110 is developed, a portion of HM layer 108 and dielectric layer 106 are plasma-etched to form a trench 109 as shown in FIG. 1C. The remaining photoresist layer 110 can also be dry-etched, for example, using plasma. However, photoresist residues 112 may exist inside trench 109, on the front surface of semiconductor substrate 101 (e.g., on the surface of HM layer 108), and/or the back surface of semiconductor substrate 101.

Figure 1D:
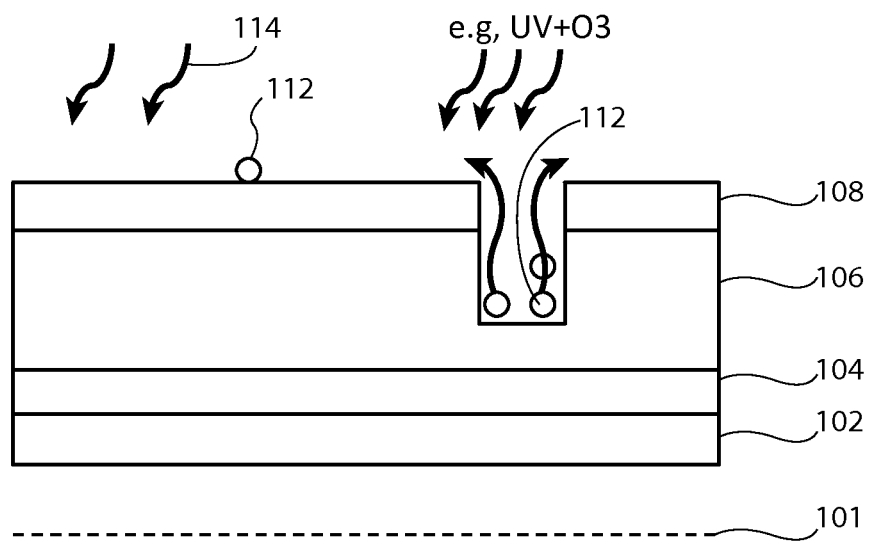
Figure 1E:
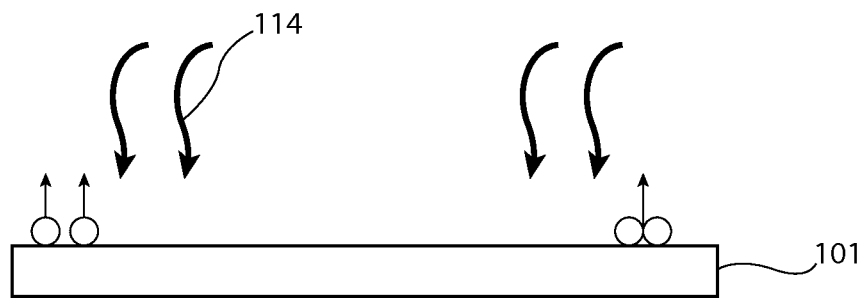

At step 408, at least one of the front side and the back side of semiconductor substrate 101 is exposed to an atmosphere comprising active oxygen, as shown in FIG. 1D and FIG. 1E. FIGS. 1D and 1E illustrate the exposure of the front side and the back side of semiconductor substrate 101, respectively. In some embodiments, at least the back side or a portion of the back side of semiconductor 101 is exposed at step 408.

In some embodiments, such exposure at step 408 is performed by exposing semiconductor substrate 101 to an atmosphere comprising oxygen plasma. Oxygen containing plasma can be generated under radio frequency (RF) energy using chemical precursors such as oxygen gas. Low dosage of oxygen containing plasma is desirable in such exposure. The plasma flow is in the range of from 1,000 sccm to 10,000 sccm, for example, at about 2000 sccm.

In some embodiments, such an exposure at step 408 is performed by irradiating semiconductor substrate 101 with UV in an atmosphere comprising ozone ($O_3$). For example, semiconductor substrate 101 is irradiated with UV in ozone at a temperature in the range of from 100° C. to 400° C., for example, from 260° C. to 280° C., or about 300° C. for a time interval in the range of from 1 second to 100 seconds, for example, from 40 second to 80 seconds, in some embodiments. $O_3$ flow is in the range of from about 1,000 to about 10,000 sccm, or about 2,000 sccm with other carrier gas such as He, Ar, $N_2$ and $H_2$.

Both the front side and the back side of semiconductor substrate 101 are simultaneously exposed to UV irradiation in an atmosphere comprising ozone ($O_3$) in some embodiments. At least a portion of the back side of semiconductor substrate 101 is exposed. An exemplary apparatus suitable for such an exposure is described in FIGS. 2A-2D, and 3A-3D.

At step 410, at least one of the front side and the back side of semiconductor substrate 101 is cleaned with a cleaning fluid. At least the front side is cleaned with a cleaning fluid in some embodiments. Both sides are cleaned with a cleaning fluid in some embodiments. Both sides can be cleaned through one step or two steps (a respective step for each respective side). Examples of a suitable cleaning fluid include but are not limited to deionized (DI) water, solvents, or any combination thereof. The cleaning fluid is DI water in some embodiments. The cleaning fluid can be applied through spraying, rinsing or any other suitable methods. DI water is sprayed onto either the front side or the back side of a semiconductor substrate 101 in some embodiments. Mechanical forces can be also used in combination of the cleaning fluid in some embodiments.

Figure 1F:
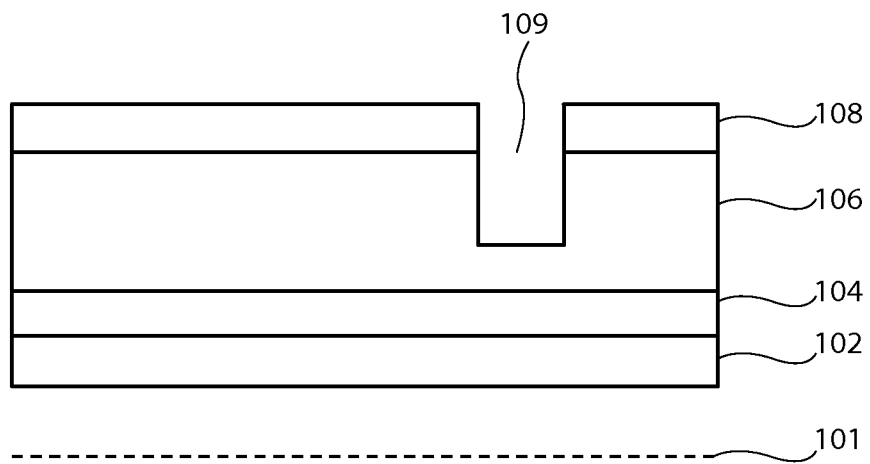

After cleaning, photoresist residues are removed. The semiconductor device being fabricated can be dried or baked, for example, at a temperature in the range of 50° C. to 100° C. The resulting structure after step 410 is illustrated in FIG. 1F.

Figure 1G:
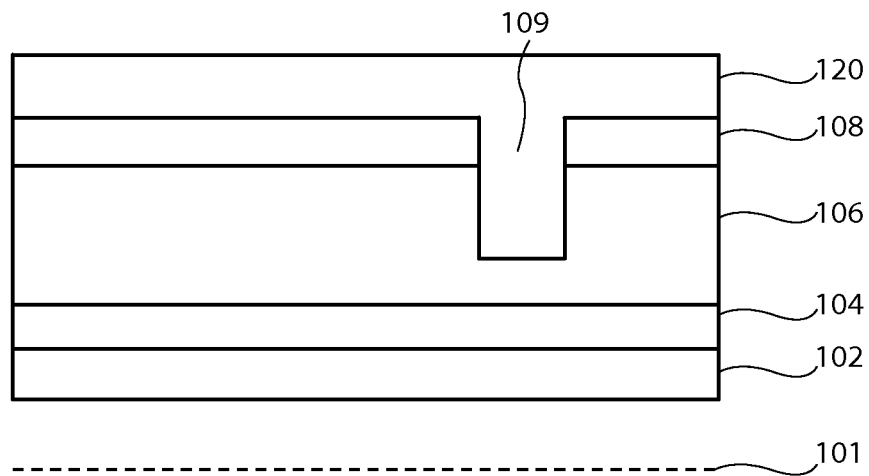

Referring to FIG. 4B, in accordance with some embodiments, method 400 further comprises steps 412, 414, 416, and 418. At step 412, a second photoresist layer 120 is coated inside trench 109 over the front side of semiconductor substrate 101. The resulting structure of the portion of the semiconductor device after step 412 is illustrated in FIG. 1G. The second photoresist layer 120 can be either negative or positive photoresist, and can be the same as, or different from, photoresist layer 110.

Figure 1H:
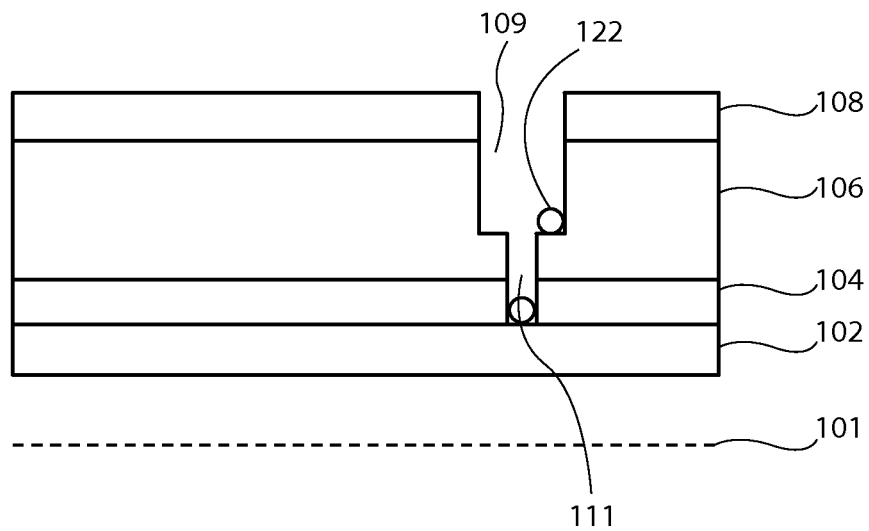

At step 414, a via hole 111 is formed inside the ES layer 104 through photoresist patterning. FIG. 1H illustrates the resulting structure of the portion of the semiconductor device being fabricated after step 414. Similar to step 406, in some embodiments, the step of forming the via hole 111 includes a dry etch process. For example, photoresist layer 120 can be exposed to UV light or other irradiation under a mask. After photoresist layer 120 is developed, a portion of the ES layer 104 is plasma-etched to form the via hole 111 as shown in FIG. 1H. The remaining photoresist layer 120 can also be dry-etched, for example, using plasma. However, photoresist residues 122 may exist inside the via hole 111, on the front surface of semiconductor substrate 101 (e.g., on the surface of HM layer 108), and/or the back surface of semiconductor substrate 101.

Figure 1I:
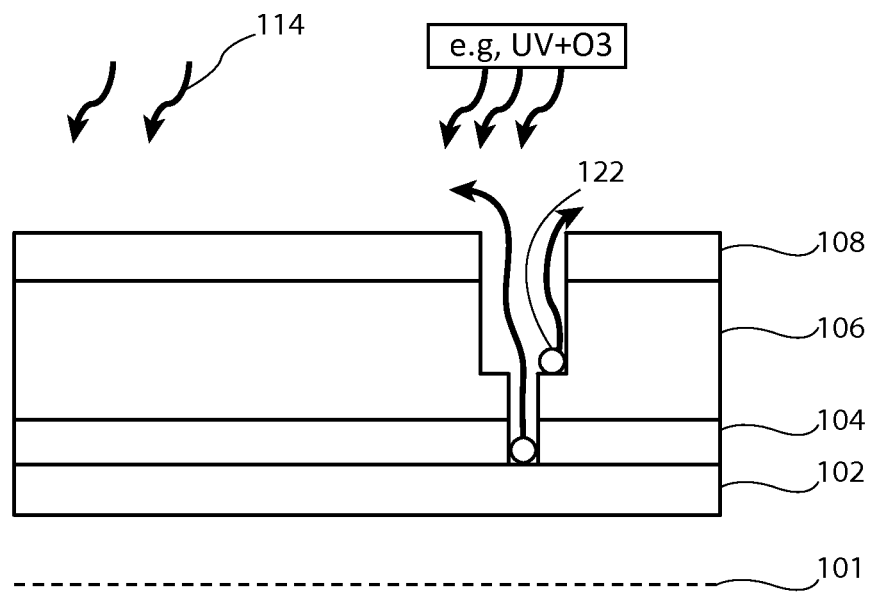
Figure 1J:
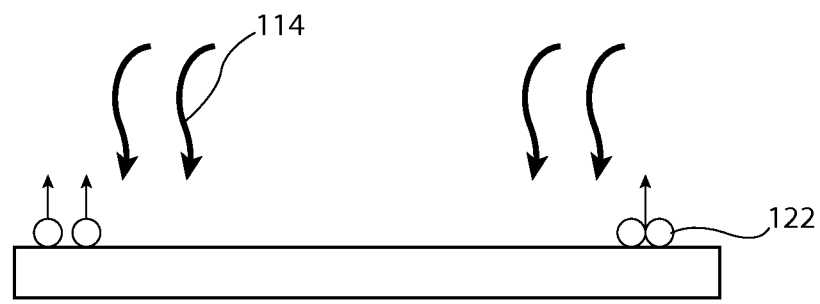

At step 416, at least one of the front side and the back side of the semiconductor substrate 101 is exposed to an atmosphere comprising active oxygen as illustrated in FIGS. 1I and 1J, for the exposure of the front side and the back side of substrate 101, respectively. In some embodiments, at least the back side or a portion of the back side of substrate 101 is exposed. Step 416 is identical to step 408 described above. In some embodiments, such an exposure at step 416 is performed by irradiating semiconductor substrate 101 with UV in an atmosphere comprising ozone ($O_3$). For example, semiconductor substrate 101 is irradiated with UV in ozone at a temperature in the range of from 100° C. to 400° C., for example, from 260° C. to 280° C., for a time interval in the range of from 1 second to 100 seconds, for example, from 40 second to 80 seconds, in some embodiments. Both the front side and the back side of semiconductor substrate 101 are simultaneously exposed to UV irradiation in an atmosphere comprising ozone ($O_3$) in some embodiments. An apparatus suitable for such exposure are described in FIGS. 2A-2D and 3A-3D.

Figure 1K:
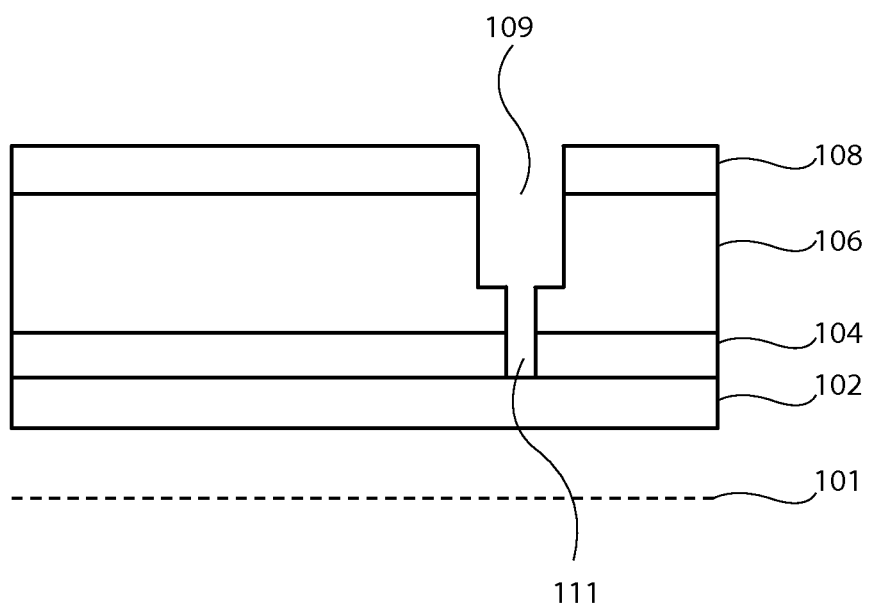

At step 418, at least one of the front side and the back side of the semiconductor substrate 101 is cleaned with a cleaning fluid. At least the front side is cleaned with a cleaning fluid in some embodiments. Step 418 is identical to step 410 described above. For example, the semiconductor device being fabricated is cleaned through spraying DI water onto both the front side and the back side of semiconductor substrate 101 in some embodiments. A drying or baking step is followed after cleaning. The resulting structure after step 418 is shown in FIG. 1K. As shown in FIG. 1K, the via hole 111 is connected with a bottom surface of the trench and a top surface of conductive layer 102. The trench 109 and via hole 111 can be filled with a conductive material in a subsequent process.

Figure 6:
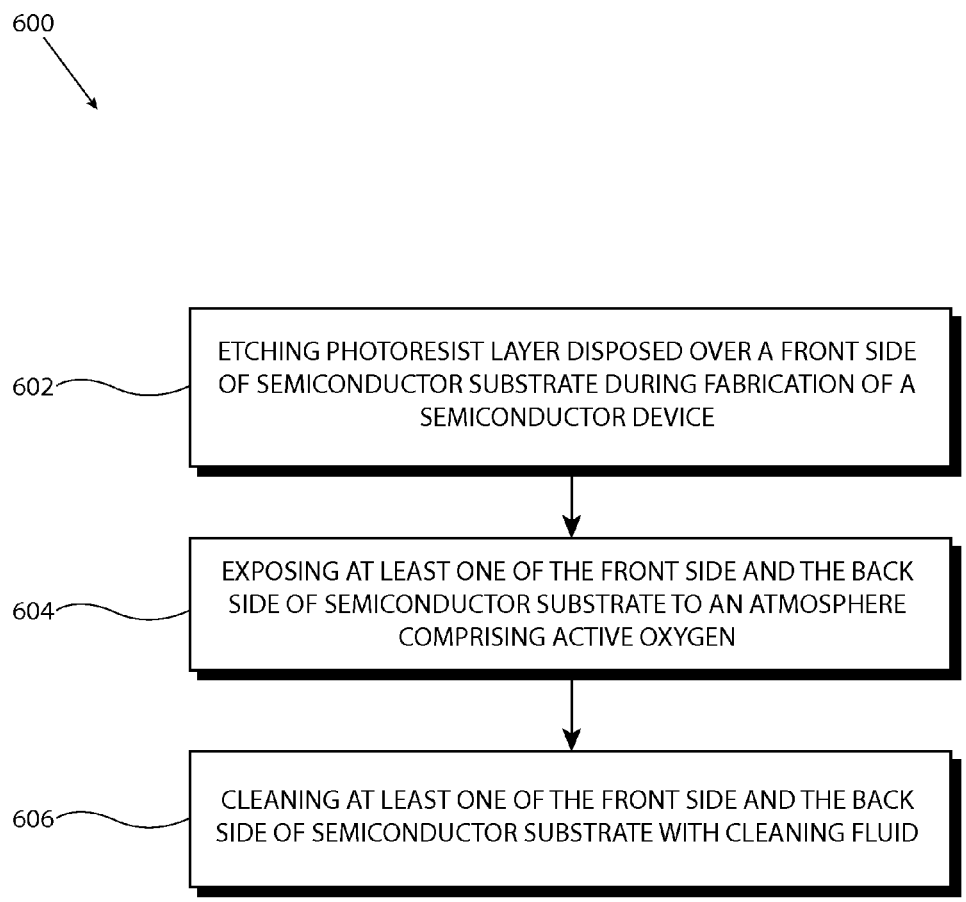
FIG. 6 is a flow chart diagram illustrating a method of removing photoresist residue after dry etching in accordance with some embodiments.

Method 400 is an exemplary method described for illustration purpose. FIG. 6 illustrates a general method 600 of removing photoresist residue after dry etch during fabrication of a semiconductor device in accordance with some embodiments.

Referring to FIG. 6, method 600 comprises steps 602, 604 and 606. At step 602, a photoresist layer disposed over a front side of a semiconductor substrate 101 is etched. Semiconductor substrate 101 has a back side opposite to the front side. In some embodiments, the etching step 602 includes a dry etch process, for example, using plasma.

At step 604, at least one of the front side and the back side of the semiconductor substrate 101 is exposed to an atmosphere comprising active oxygen. A portion of the back side of semiconductor substrate 101 is exposed in some embodiments. Step 604 is identical to step 408 described above. For example, in some embodiments, such exposure is performed by irradiating the semiconductor substrate with ultra violet (UV) light in an atmosphere comprising ozone ($O_3$). In other embodiments, such exposure is performed by exposing the semiconductor substrate to an atmosphere comprising oxygen plasma. In some embodiments, both the front side and the back side of semiconductor substrate 101 are simultaneously exposed to an atmosphere comprising active oxygen.

At step 606, at least one of the front side and the back side of the semiconductor substrate 101 is cleaned with a cleaning fluid. Step 606 is identical to step 410 described above. For example, in some embodiments, the cleaning fluid is deionized (DI) water.

Method 600 can further comprise additional steps 604 and 606. In some embodiments, at least a second step 604 is used.

The present disclosure also provides an apparatus which can be used for the process described above. The apparatus comprises a top lamp module for generating UV light to irradiate one side of a semiconductor substrate, and at least one side UV module configured to generate or reflect UV light to irradiate the other side of the semiconductor substrate.

Figure 2A:
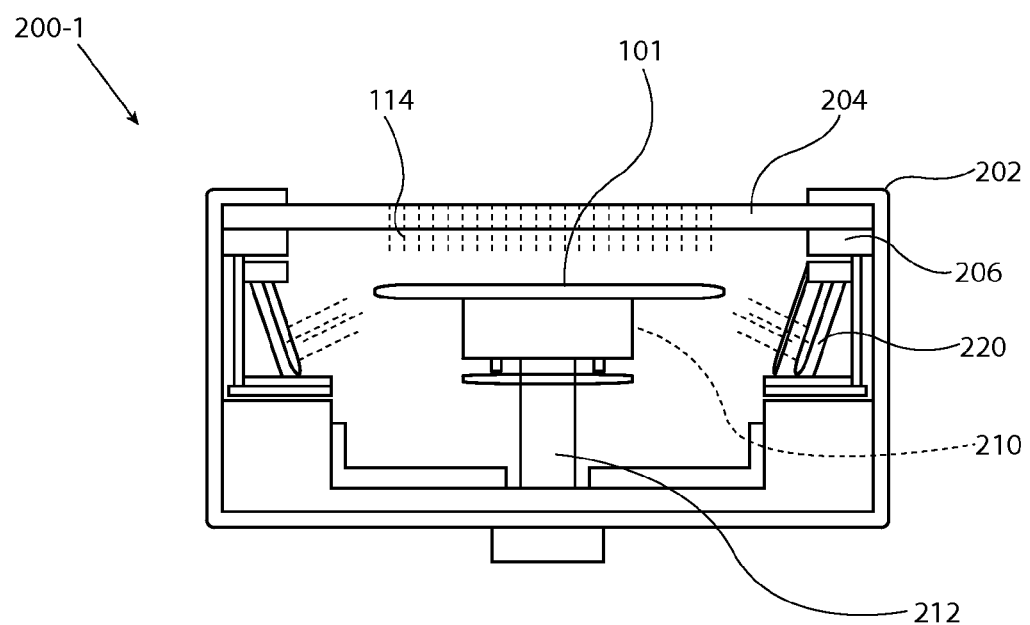
FIGS. 2A-2D illustrate an exemplary apparatus comprising a top UV lamp module and a side UV lamp module configured to irradiate both the front and the back surfaces of a semiconductor wafer in accordance with some embodiments.
Figure 2B:
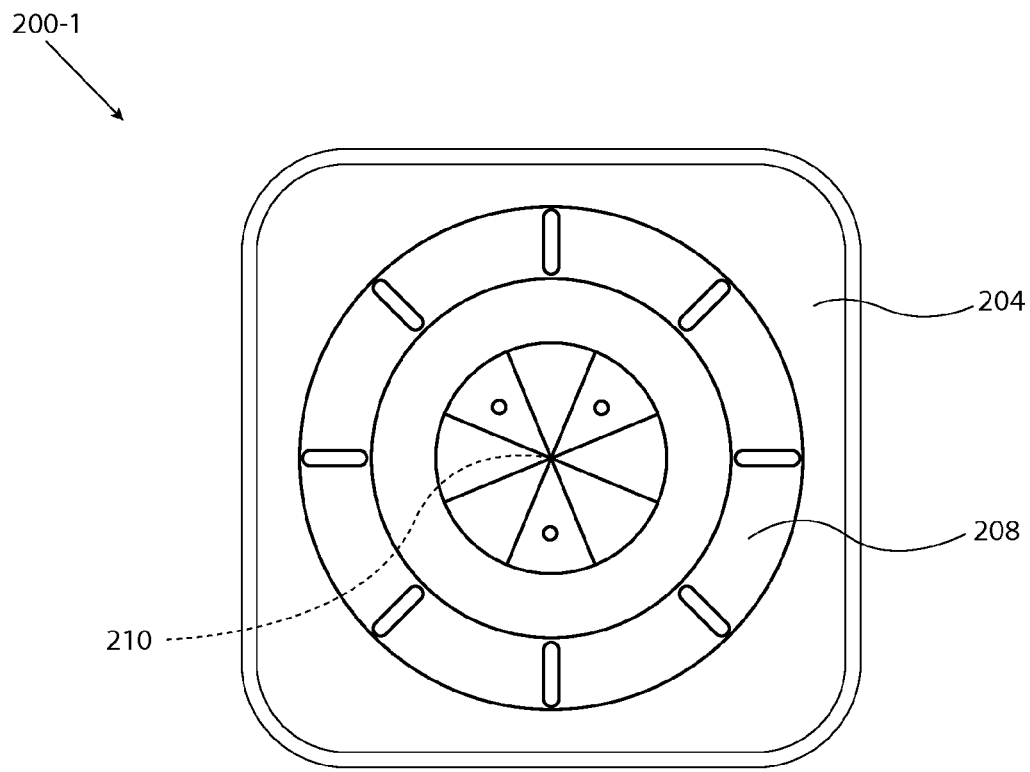
Figure 2C:
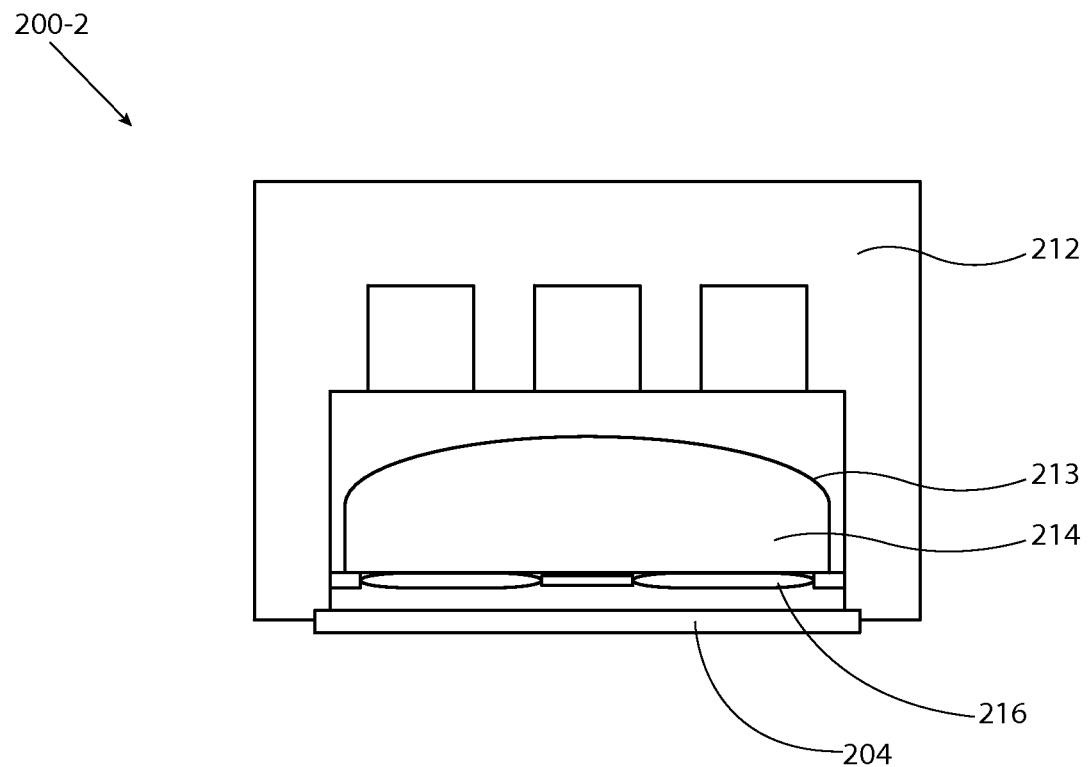
Figure 2D:
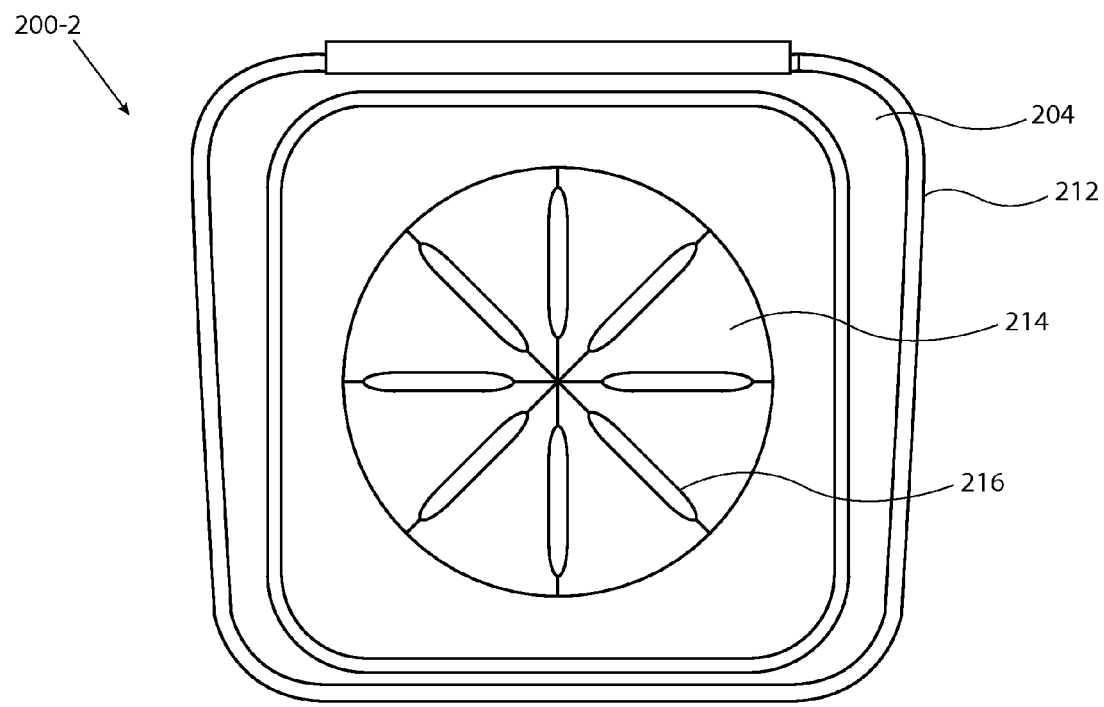

FIGS. 2A-2D illustrate an exemplary apparatus 200 comprising a top UV lamp module 214 and a side UV lamp module 220 configured to irradiate both the front and the back surfaces of a semiconductor wafer 101 in accordance with some embodiments. FIG. 2A is a cross-sectional view of the bottom part 200-1 of apparatus 200. FIG. 2B is a schematic top-down view of the bottom part 200-1 of apparatus 200. FIG. 2C is a cross-sectional view of the top part 200-2 of apparatus 200. FIG. 2D is a schematic top-down view of the top part 200-1 of apparatus 200 showing an exemplary configuration of the top UV lamp module 214.

Apparatus 200 comprises a chamber 202, a UV transparent window 204 on a top surface of chamber 202, a wafer chuck 210 inside chamber 202 and below the UV transparent window 204, a top lamp module 214 above the UV transparent window 204, and at least one side UV module 220 inside chamber 202.

As shown in FIG. 2A, wafer chuck 210 inside chamber 202 is configured to hold a semiconductor substrate 101. As described in FIG. 1A, semiconductor substrate 101 has two sides including has a front side and a back side. Wafer chuck 210 is coupled with the bottom of chamber 202 through a support stage 212 in some embodiments. In some embodiments, wafer chuck 210 is configured to heat up to a temperature in the range of from 100° C. to 400° C., for example, 260° C. to 280° C.

The UV transparent window 204 can be made of a material which is transparent to UV light. The UV transparent window 204 is a quartz window in some embodiments. A pumping ring is located underneath the UV transparent window 204 in some embodiments.

Referring to FIG. 2C-2D, above the UV transparent window 204, the top lamp module 214 has at least one UV lamp 216, which is configured to generate UV light 114 and irradiate the front side of a semiconductor substrate 101 through the UV transparent window 204. The wavelength of UV light is in the range of 200 nm to 400 nm. A dome reflector 213 is disposed above the at least one UV lamp 216 in some embodiments. Dome reflector 213 is configured to reflect UV light toward the UV transparent window 204. The chamber wall 212 on the top part of apparatus 200 is connected with chamber 202 in some embodiments.

Referring to FIG. 2A-2B, below the UV transparent window 204, the at least one side UV module 220 is configured to generate UV light to irradiate the back side of a semiconductor substrate 101 above wafer chuck 210 in some embodiments. Chamber 202 is also configured to provide a reactive gas therein in some embodiments. Chamber 202 comprises a feeding inlet and a vacuum port (not shown). In some embodiments, the reactive gas provided in the chamber comprises ozone. The reactive gas can be provided into an inlet (not shown) on a wall of the chamber 202. An inlet may be also fluidly connected with a manifold (not shown) inside the chamber 202 below the UV transparent window 204 and above wafer chuck 210. Both the inlet and manifold can be fluidly connected with an outlet on a wall of the chamber 202.

Figure 3A:
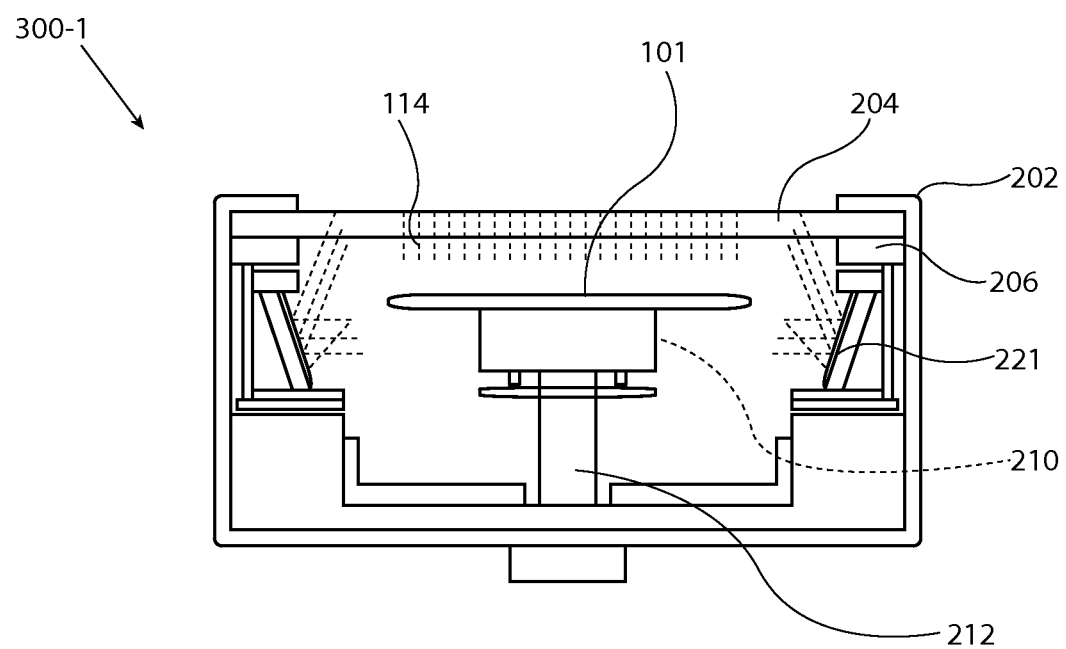
FIGS. 3A-3D illustrate an exemplary apparatus comprising a top UV lamp module and a side UV reflector configured to irradiate both the front and the back surfaces of a semiconductor wafer in accordance with some embodiments.
Figure 3B:
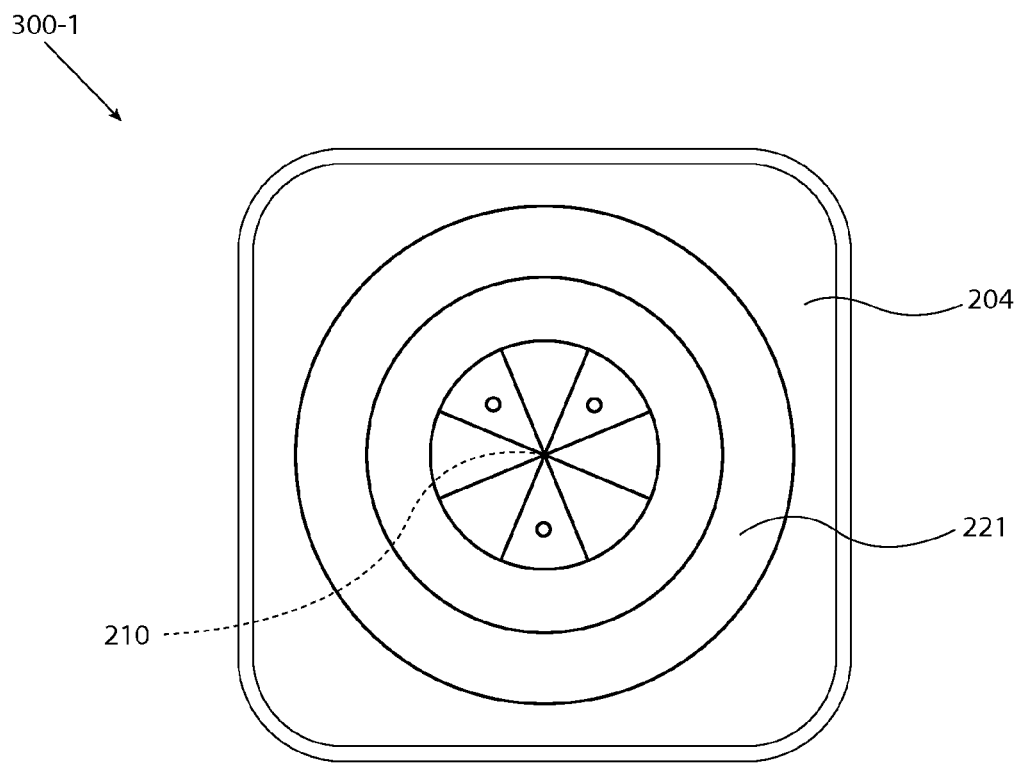
Figure 3C:
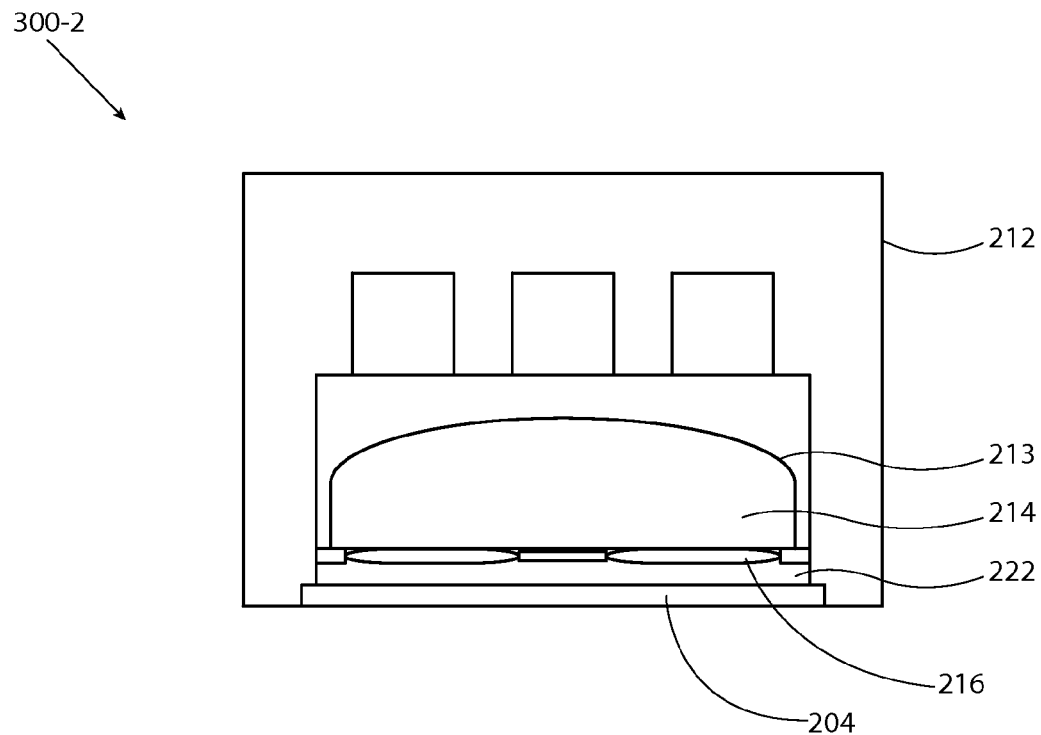
Figure 3D:
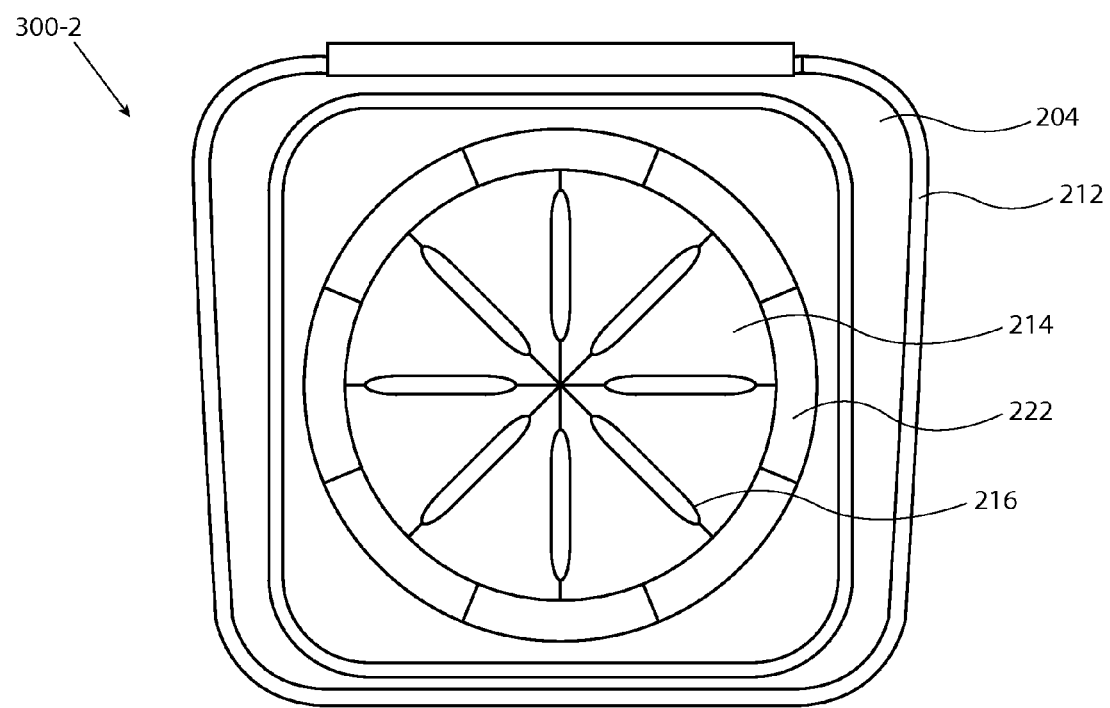

FIGS. 3A-3D illustrate an exemplary apparatus 300 comprising a top UV lamp module 214 and a side UV reflector 221 configured to irradiate both the front and the back surfaces of a semiconductor wafer 101 in accordance with some embodiments. FIG. 3A is a cross-sectional view of the bottom part 300-1 of apparatus 300. FIG. 3B is a schematic top-down view of the bottom part 300-1 of apparatus 300. FIG. 3C is a cross-sectional view of the top part 300-2 of apparatus 300. FIG. 3D is a schematic top-down view of the top part 300-1 of apparatus 300 showing an exemplary configuration of the top UV lamp module 214. Apparatus 300 is similar to apparatus 200 described above, except that the at least one side UV module is at least one side reflector 221 configured to reflect UV light from the top lamp module 214 to the back side of a semiconductor substrate in some embodiments.

The present disclosure provides a method for removing photoresist residue during fabrication of semiconductor device, a method for making a semiconductor device having via hole which comprises a method of removing photoresist residue, and an apparatus which can be used for the process in accordance with some embodiments.

In one aspect, the present disclosure a method for removing photoresist residue during fabrication of semiconductor device. The method comprises dry etching a photoresist layer disposed over a front side of a semiconductor substrate during fabrication of a semiconductor device. The semiconductor substrate has a back side opposite to the front side. The method further comprises exposing at least one of the front side and the back side of the semiconductor substrate to an atmosphere comprising active oxygen, and cleaning at least one of the front side and the back side of the semiconductor substrate with a cleaning fluid. In some embodiments, the method further comprises additional steps of exposing at least one of the front side and the back side of the semiconductor substrate to atmosphere comprising active oxygen; and cleaning at least one of the front side and the back side of the semiconductor substrate with a cleaning fluid.

In some embodiments, exposing at least one of the front side and the back side of the semiconductor substrate to an atmosphere comprising active oxygen is performed by irradiating the semiconductor substrate with ultra violet (UV) light in an atmosphere comprising ozone ($O_3$). In other embodiments, exposing at least one of the front side and the back side of the semiconductor substrate to an atmosphere comprising active oxygen is performed by exposing the semiconductor substrate to an atmosphere comprising oxygen plasma. In some embodiments, both the front side and the back side of the semiconductor substrate are simultaneously exposed to an atmosphere comprising active oxygen. In some embodiments, the cleaning fluid is deionized (DI) water.

In another aspect, the present disclosure provides a method for making a semiconductor device having via hole. Such a method comprises a method of removing photoresist residue in accordance with some embodiments. The method comprises forming a conductive layer, an etch stop (ES) layer, a dielectric layer and a hard mask (HM) layer over a front side of a semiconductor substrate. The semiconductor substrate has a back side opposite to the front side. The method further comprises patterning a photoresist layer over the front side of the semiconductor substrate; forming a trench through the HM layer and in the dielectric layer through photoresist patterning; exposing at least the back side of the semiconductor substrate to an atmosphere comprising active oxygen; and cleaning at least the front side of the semiconductor substrate with a cleaning fluid.

In such a method in accordance with some embodiments, the step of forming a conductive layer, an ES layer, a dielectric layer and a HM layer comprises: forming a conductive layer over the front side of the semiconductor substrate; forming an ES layer over the conductive layer; forming a dielectric layer over the ES layer; and depositing a HM layer over the dielectric layer. In some embodiments, the step of forming the trench includes a dry etch process. In some embodiments, exposing at least the back side of the semiconductor substrate to an atmosphere comprising active oxygen is performed by exposing the semiconductor substrate to an atmosphere comprising oxygen plasma. In some embodiments, exposing at least the back side of the semiconductor substrate to an atmosphere comprising active oxygen is performed by irradiating the semiconductor substrate with UV in an atmosphere comprising ozone ($O_3$). For example, the semiconductor substrate is irradiated with UV in ozone at a temperature in the range of from 100° C. to 400° C., for example, from 260° C. to 280° C. for a time interval in the range of from 1 second to 100 seconds in some embodiments. Both the front side and the back side of the semiconductor substrate are simultaneously exposed to UV irradiation in an atmosphere comprising ozone ($O_3$) in some embodiments.

In some embodiments, the method further comprises patterning a second photoresist layer inside the trench over the front side of the semiconductor substrate; forming a via hole inside the ES layer; exposing at least the back side of the semiconductor substrate to an atmosphere comprising active oxygen; and cleaning at least the front side of the semiconductor substrate with a cleaning fluid. The via hole is connected with a bottom surface of the trench and a top surface of the conductive layer.

In another aspect, the present disclosure provides an apparatus. The apparatus comprises a chamber; a UV transparent window on a top surface of the chamber; a wafer chuck inside the chamber and below the UV transparent window; a top lamp module above the UV transparent window; and at least one side UV module inside the chamber. The chamber is configured to provide a reactive gas therein. The wafer chuck is configured to hold a semiconductor substrate having a front side and a back side. The top lamp module has at least one UV lamp, which are configured to generate UV light and irradiate the front side of a semiconductor substrate through the UV transparent window. The at least one side UV module is configured to generate or reflect UV light to irradiate at least one portion of the back side of a semiconductor substrate.

In some embodiments, the at least one side UV module is at least one side UV lamp configured to generate UV light emitting toward the back side of a semiconductor substrate. In some embodiments, the at least one side UV module is at least one side reflector configured to reflect UV light from the top lamp module to the back side of a semiconductor substrate. In some embodiments, the reactive gas provided in the chamber comprises ozone. In some embodiments, the UV transparent window is a quartz window. In some embodiments, the wafer chuck is configured to heat up to a temperature in the range of from 100° C. to 400° C.

Although the subject matter has been described in terms of exemplary embodiments, it is not limited thereto. Rather, the appended claims should be construed broadly, to include other variants and embodiments, which may be made by those skilled in the art.

What is claimed is:

1. A method, comprising:
    dry etching a photoresist layer disposed over a front side of a semiconductor substrate during fabrication of a semiconductor device, the semiconductor substrate having a back side opposite to the front side;
    exposing at least one of the front side and the back side of the semiconductor substrate to an atmosphere comprising active oxygen, wherein during the exposing step at least a portion of the back side of the semiconductor substrate is irradiated by ultra-violet (UV) light generated or reflected from at least one side UV module inside the chamber; and
    cleaning at least one of the front side and the back side of the semiconductor substrate with a cleaning fluid.

2. The method of claim 1, wherein the method further comprises repeating the exposing and cleaning steps.

3. The method of claim 1, wherein exposing at least one of the front side and the back side of the semiconductor substrate to an atmosphere comprising active oxygen is performed by irradiating the semiconductor substrate with ultra violet (UV) light in an atmosphere comprising ozone ($O_3$).

4. The method of claim 3, wherein the semiconductor substrate is irradiated with UV in ozone at a temperature in the range of from 100° C. to 400° C. for a time interval in the range of from 1 second to 100 seconds.

5. The method of claim 3, wherein both the front side and the back side of the semiconductor substrate are simultaneously exposed to UV irradiation in an atmosphere comprising ozone ($O_3$).

6. The method of claim 3, wherein in the step of exposing at least one of the front side and the back side of the semiconductor substrate to an atmosphere comprising active oxygen, the front side of the semiconductor substrate is irradiated with UV light in a chamber having an atmosphere comprising ozone ($O_3$), the UV light is generated by a top lamp module above a UV transparent window on the top surface of the chamber.

7. The method of claim 1, wherein exposing at least one of the front side and the back side of the semiconductor substrate to an atmosphere comprising active oxygen is performed by exposing the semiconductor substrate to an atmosphere comprising oxygen plasma.

8. The method of claim 1, wherein both the front side and the back side of the semiconductor substrate are simultaneously exposed to an atmosphere comprising active oxygen.

9. The method of claim 1, wherein the cleaning fluid is deionized (DI) water.

10. The method of claim 1, further comprising:
    forming a conductive layer, an etch stop layer, a dielectric layer and a hard mask layer over a front side of the semiconductor substrate;
    patterning a photoresist layer over the front side of the semiconductor substrate, before the step of drying etching the photoresist layer; and
    dry etching through a portion of the hard mask layer and the dielectric layer to form a trench.

11. The method of claim 10, wherein forming a conductive layer, an etch stop layer, a dielectric layer and a hard mask layer over a front side of a semiconductor substrate comprises:
    forming a conductive layer over the front side of the semiconductor substrate;
    forming an etch stop layer over the conductive layer;
    forming a dielectric layer over the etch stop layer; and
    depositing a hard mask layer over the dielectric layer.

12. A method, comprising:
    forming a conductive layer, an etch stop layer, a dielectric layer and a hard mask layer over a front side of a semiconductor substrate during fabrication of a semiconductor device, the semiconductor substrate having a back side opposite to the front side;
    patterning a photoresist layer over the front side of the semiconductor substrate;
    forming a trench through the hard mask layer and in the dielectric layer, the step of forming the trench comprising dry etching the photoresist layer disposed over the front side of the semiconductor substrate;
    exposing at least the back side of the semiconductor substrate to an atmosphere comprising active oxygen;
    cleaning at least the front side of the semiconductor substrate with a cleaning fluid;
    patterning a second photoresist layer inside the trench over the front side of the semiconductor substrate;
    forming a via hole inside the etch stop layer, the via hole connected with a bottom surface of the trench and a top surface of the conductive layer; and
    repeating the exposing and cleaning steps.

13. The method of claim 12, wherein forming a conductive layer, an etch stop layer, a dielectric layer and a hard mask layer over a front side of a semiconductor substrate comprises:
    forming a conductive layer over the front side of the semiconductor substrate;
    forming an etch stop layer over the conductive layer;
    forming a dielectric layer over the etch stop layer; and
    depositing a hard mask layer over the dielectric layer.

14. The method of claim 12, wherein the step of forming the trench includes dry etching a portion of the hard mask layer and the dielectric layer.

15. The method of claim 12, wherein exposing at least the back side of the semiconductor substrate to an atmosphere comprising active oxygen is performed by exposing the semiconductor substrate to an atmosphere comprising oxygen plasma.

16. The method of claim 12, wherein exposing at least the back side of the semiconductor substrate to an atmosphere comprising active oxygen is performed by irradiating the semiconductor substrate with UV in an atmosphere comprising ozone ($O_3$).

17. The method of claim 16, wherein the semiconductor substrate is irradiated with UV in ozone at a temperature in the range of from 100° C. to 400° C. for a time interval in the range of from 1 second to 100 seconds.

18. The method of claim 16, wherein both the front side and the back side of the semiconductor substrate are simultaneously exposed to UV irradiation in an atmosphere comprising ozone ($O_3$).

* * * * *